US006600224B1

(12) United States Patent
Farquhar et al.

(10) Patent No.: US 6,600,224 B1
(45) Date of Patent: Jul. 29, 2003

(54) THIN FILM ATTACHMENT TO LAMINATE USING A DENDRITIC INTERCONNECTION

(75) Inventors: Donald S. Farquhar, Endicott, NY (US); Raymond T. Galasco, Vestal, NY (US); Sung Kwon Kang, Chappaqua, NY (US); Mark D. Poliks, Vestal, NY (US); Chandrika Prasad, Wappingers Falls, NY (US); Roy Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/703,062

(22) Filed: Oct. 31, 2000

(51) Int. Cl.[7] .............................................. H01L 23/12
(52) U.S. Cl. ...................... 257/731; 257/678; 257/686; 257/782
(58) Field of Search ................................ 257/731, 782, 257/795, 678, 686; 439/66; 174/52.4

(56) References Cited

U.S. PATENT DOCUMENTS

| 5,136,365 | A | | 8/1992 | Pennisi et al. |
|---|---|---|---|---|
| 5,187,020 | A | | 2/1993 | Kwon et al. |
| 5,375,042 | A | * | 12/1994 | Arima et al. ................ 174/255 |
| 5,412,539 | A | * | 5/1995 | Elwell et al. ................ 174/255 |
| 5,509,200 | A | * | 4/1996 | Frankeny et al. ........... 174/266 |
| 5,518,674 | A | * | 5/1996 | Powell et al. ............... 264/104 |
| 5,805,426 | A | | 9/1998 | Merritt et al. |
| 5,893,765 | A | | 4/1999 | Farnworth |
| 5,905,638 | A | | 5/1999 | MacDonald et al. |
| 5,910,641 | A | | 6/1999 | Gaynes et al. |
| 6,090,633 | A | * | 7/2000 | Yu et al. ....................... 438/15 |
| 6,326,561 | B1 | * | 12/2001 | Watanabe et al. ........... 174/260 |

* cited by examiner

Primary Examiner—Michael S. Lebentritt
Assistant Examiner—Douglas Menz
(74) Attorney, Agent, or Firm—Scully, Scott, Murphy & Presser; Arthur J. Samodovitz, Esq.

(57) ABSTRACT

An electronic interconnection assembly having a thin film bonded to either a glass ceramic or to an organic laminate substrate, and a method for attaching a thin film wiring package to the substrate. Provided is the utilization of adhesives which may be processed at significantly lower temperatures so as to avoid damaging components, the wiring package and interconnection joints. Moreover, pursuant to specific aspects, the joining of the thin film to the substrate may be implemented with the utilization of dendrites.

19 Claims, 5 Drawing Sheets

THIN FILM ATTACHMENT TO LAMINATE USING A DENDRITIC INTERCONNECTION

BACKGROUND OF THE INVENTION

1. Field of the Invention

The present invention relates to thin film bonding to a carrier, such as either as a glass ceramic or to an organic laminate substrate, and to a method for attaching a thin film wiring package to the substrate. More particularly, the invention relates to the utilization of joining materials, such as adhesives that may be processed at temperatures sufficiently low so as to avoid damaging electronic components, the wiring package and interconnection joints. Moreover, pursuant to specific aspects of the invention, the joining of the thin film to the substrate may be implemented with the novel and unique utilization of dendrites.

Currently, considerable drawbacks and limitations are being encountered in the technology with regard to the joining of thin film wiring packages to different kinds of substrates, particularly such as thin film transfer joining. Thin film wiring layers are well known as a means to provide additional wiring density on the outer layer of a glass ceramic module. This is a sequential build up process, using a material set that is compatible with relatively high temperature processing that is associated with the use of high melt solders such as 90/10 Pb/Sn.

Pursuant to the invention, this technology is improved through means intended to adapt the use of thin film wiring layers to 1) a parallel process and 2) a material set compatible with relatively low temperature processing associated with eutectic solder (63 Pb/37Sn). Thus, the invention facilitates the attachment of a thin film wiring layer (providing additional wiring density) on a organic wiring board in parallel (or independent) processes.

A fundamental motivation for joining a thin film to a laminate is presented in a number of aspects, as set forth hereinbelow.

a) The thin film, in general, may be produced with finer circuit lines and higher density packaging versus the organic laminate printed wiring board. Selectively locating high density regions of wiring atop the printed wiring board using the thin film in a glued-on fashion, similar to the appliance of a postage stamp, provides localized high density wiring, without requiring the entire printed wiring board to be processed through the more expensive higher density manufacturing processes of the thin film.

b) Building the laminate and the thin film separately (in parallel) is preferred as opposed to building the thin film directly on the laminate (in serial). This is advantageous because it is less costly due to manufacturing yield concerns.

c) The printed wiring board can be produced with widely known processes. The thin film can be produced with any number of known processes, and it could be of a wide range of packaging density. The present invention shows it to be of a much more dense circuitization than the printed wiring board.

d) The use of a thin film joining technique applied to an organic laminate printed wiring board is fundamentally different than a joining technique applied to a glass ceramic substrate. This is due to the maximum permissible processing temperature. For an organic laminate such as a printed wiring board, the maximum temperature is typically around 190 to 240 C. for short durations. This is a requirement because the widely employed eutectic solder (63 Pb/37 Sn) melts at 183 C., so to attach components, this temperature must be exceeded. For a glass ceramic substrate, the temperatures can be much higher, and typically solders of higher melting point are used, such as 90 Pb/10 Sn, requiring the use of different materials.

2. Discussion of the Prior Art

Various methods and apparatus are presently disclosed in the state-of-the-art concerning the attachment of adhesives or thin films to different types of substrates.

Gaynes et al., U.S. Pat. No. 5,910,641 discloses the forming of an electrical connection by the utilization of a conductive adhesive film containing dendritic particles. These dendritic particles contain sharp edges which penetrate the oxide coatings on the metal pads of a module in which the film is adhered to a substrate.

Merritt et al., U.S. Pat. No. 5,805,426 discloses a conductive film containing nanopores which are filled with nanoscopic fibers or tubules, and wherein the film possesses an anisotropic electrical conductivity or Z-axis conductivity.

MacDonald, Jr. et al., U.S. Pat. No. 5,905,638 discloses an elastomeric connector system which is applied to provide for the interconnection of microelectronic devices. The elastomer is generally constituted of silicone or fluorosilicone gels, and does not possess any similarities with the present inventive arrangement or method of providing dendritic connections between a thin film and a substrate.

Kwon et al., U.S. Pat. No. 5,187,020 discloses a structure for integrated circuits which provides a compliant metal contact pad for electrical testing by means of probes. The structure, which is built on top of I/O pads consists of a compliant conductive layer of conducting adhesive and a metal bump, and essentially differs in vital aspects from the present inventive concept.

Farnworth U.S. Pat. No. 5,893,765 discloses a Z-elastomeric connection system for a semiconductor package and does not direct itself to the thin film attachment to a laminate or other type of substrate using the inventive interconnections.

Pennisi et al. U.S. Pat. No. 5,136,365 discloses an adhesive material consisting of a fluxing agent, metal particles, a thermoset resin and a curing agent, whereby the metal is selected from a group of materials consisting of lead, tin, indium, bismuth, antimony and silver. The metal particles are melted in order to form a metallurgical bond with the electrical components and the substrate during-reflow soldering. Although possessing some similarities to the inventive concept in terms of a metallurgical bond which is to be formed during joining, the present invention is related more closely to the filler material particles which are coated with a low melting point metal alloy, and also the use of new conducting adhesive materials, and consequently provides for an improvement over the art.

Moreover, also of general interest are the IBM Technical Data Bulletin Volume 32, Number 10b, March 1990, Page 476; and the IBM Technical Data Bulletin Volume 35, Number 3, August 1992, Page 130, which are not unduly applicable to the invention inasmuch as they are primarily representative of the current state-of-the-art providing for thin film attachments to laminates.

SUMMARY OF THE INVENTION

Accordingly, pursuant to the present invention there is disclosed the aspect of providing a novel method and structure which are adapted for the joining of a thin film to a printed wiring board (PWB) or suitable substrate. Pursuant to a particular aspect of the invention, the thin film is provided with solder balls at each connection, which could conceivably span a range of alloys and melting temperatures, and wherein the printed wiring board would be provided with matching copper pads. Various means of now forming the required electrical interconnections between the thin film and the printed wiring board are possible. One such means is to use a solder paste, selectively patterned onto the copper pads of the printed wiring board, in combination with an adhesive spacer material that contains apertures corresponding to electrical connections. Upon aligning the three elements (thin film, spacer adhesive, and printed wiring board), and subsequently applying heat and pressure, a unitary structure is formed with electrical interconnections formed by the solder paste and a mechanical reinforcement provided by the spacer adhesive.

A second means of forming the interconnection avoids the use of solder paste. Instead, a special metallurgy is created on the copper pads of the printed wiring board, consisting of Pd (Palladium) dendrites. The thin film may be positioned above the printed wiring board, and a predrilled spacer material utilized as an adhesive layer.

Thereafter, upon an application of heat and pressure, while not necessarily exceeding the melt temperature of the solder, the connection would be made by forcing the dendrite-plated copper pad to penetrate the joining technology, while simultaneously adhering the spacer material to both the laminate and the thin film. This particular aspect can also be readily applied to the attachment of the thin film to a ceramic substrate.

Pursuant to the invention, there may be employed a photolithographed adhesive material as a spacer material. For example, an photoimagable dielectric layer such as Shipley Ronel product tradename Dyna Via 2000, could be deposited after the dendrites have been made, and then removed from over the dendrites. Consequently, if the dielectric is only partially cured (b-staged) it could be readily laminated to the thin film concurrently with the forming of the electrical connections.

Moreover, according to the invention, a further variation would be an elimination of the spacer material and to underfill a gap, for example, of approximately 0.003 inches after the film has been attached to the laminate substrate.

Another concept of the invention would be to obviate the use of eutectic solder connections wherein a connection is normally formed which remelts subsequent to the attachment of a component. The use of solder has the advantage that upon melting surface tension forces tend to align the connecting pads from the printed wiring board to those of the component. Thus there is normally no external pressure applied to the component and the solder joints are generally self-aligning in nature. However, in the implementing of a lamination process, there is encountered a significant amount of external pressure which could overwhelm any self-alignment due to surface tension, thereby possibly producing unreliable or defective solder connections in the finished product.

With a view towards overcoming the foregoing limitation, pursuant to the invention, an advantage of the dendrite utilization resides in that the dendrites prevent slippage of the thin film during the lamination process. This problem has been previously observed when attempting to join a thin film to a ceramic substrate with melting solder balls. Consequently, another advantage would be that the connection could be effected with pressure alone, and then the thin film carrier plate can be removed prior to fully heating and curing the spacer material. The thin film carrier being constituted of glass is optional. Further, it need not be made of glass, but would be chosen as a material that has the appropriate thermal expansion and stiffness to match the characteristics of the thin film and the printed wiring board. This would avoid the problem of the large coefficient of thermal expansion (CTE) mismatch between a glass carrier and a laminate, and within a further advantage resides in that the joints could potentially be tested prior to permanently forming the lamination.

According to the invention, there is also addressed the problem encountered in the conductive bonding of a polyimide (PI) thin film (TF) organic wiring package to a glass ceramic or organic laminate substrate. This task may be implemented utilizing 90/10 Pb/Sn soldered Ni-plated metal features mixed metallurgy separated by a punched adhesive coated polyimide spacer. The solder reflow process of BGA's (ball grid arrays) involves high temperature excursions (up to 350° C.) which may readily impart damage to the components, to the package and adversely affect the reliability of the C4 (controlled collapse chip connection) joints.

As an alternative to the interconnection process using dendrites, the invention contemplates a third means utilizing an isotropic or anisotropic conductive adhesive which may be processed at a significantly lower temperature. An approach to the problem which is addressed by the present invention is the employment of a photoimageable spacer material layer (for instance Shipley Ronal product tradename Dyna Via 2000) which is coated to one layer of the structure; for example, such as the laminate substrate which is to carry the thin film of the structure by roll lamination or direct liquid coating. The copper surfaces of the laminate may be black oxidized (for example, through the known black oxide process) in order to promote adhesion. Additional improvements to adhesion may also be achieved by use of a suitable post treatment which will also assist in limiting ion migration and potential corrosion at this layer interface. A photographic image process may be employed to define vias in TF-IO in the photoimagable spacer material in a pattern corresponding to the conductive pads on the thin film and the printed wiring board. A B-stage bake may be employed to partially cure the material, rendering the material sufficiently stable to be handled during the next stages of the process, as well as being adherent to the PI-TF (polyimide-thin film) surface upon joining. The thickness of this interposer may be controlled and could typically be about 2–3 mils. Improved adhesion of the advanced solder mask to the polyimide film may be achieved by use of a vapor blast surface roughening step.

It is also possible to utilize an adhesive spacer which may be patterned by various means such as drilling, routing, laser ablation or plasma processing. Once adhered to the laminate substrate, the conductive adhesive would be screened into the features and still serves to contain the latter. The conditions of any final joining would then depend upon the properties of the spacer material, augmented by the process requirements of the conductive adhesive, as described hereinabove.

Accordingly, it is an object of the present invention to provide an electric interconnection assembly for a novel thin film attachment to a laminate printed wiring board.

A more specific object of the present invention is to provide an electronic interconnection assembly for thin film attachment to a laminate utilizing an interposer, such as an adhesive layer, which may be a photoimaged material which does not require any mechanical alignment of a punched thin film.

Another object of the invention resides in the provision of a method for utilizing the electronic interconnection assembly for the thin film attachment to a laminate by employing a dendritic interconnection.

Still another object of the present invention is to provide a method as described herein for attaching a thin film to either an organic laminate, or to a ceramic substrate.

BRIEF DESCRIPTION OF THE DRAWINGS

Reference may now be made to the following detailed description of preferred embodiments of the invention, taken in conjunction with the accompanying drawings; in which.

DETAILED DESCRIPTION OF PREFERRED EMBODIMENTS

Figure 1A:
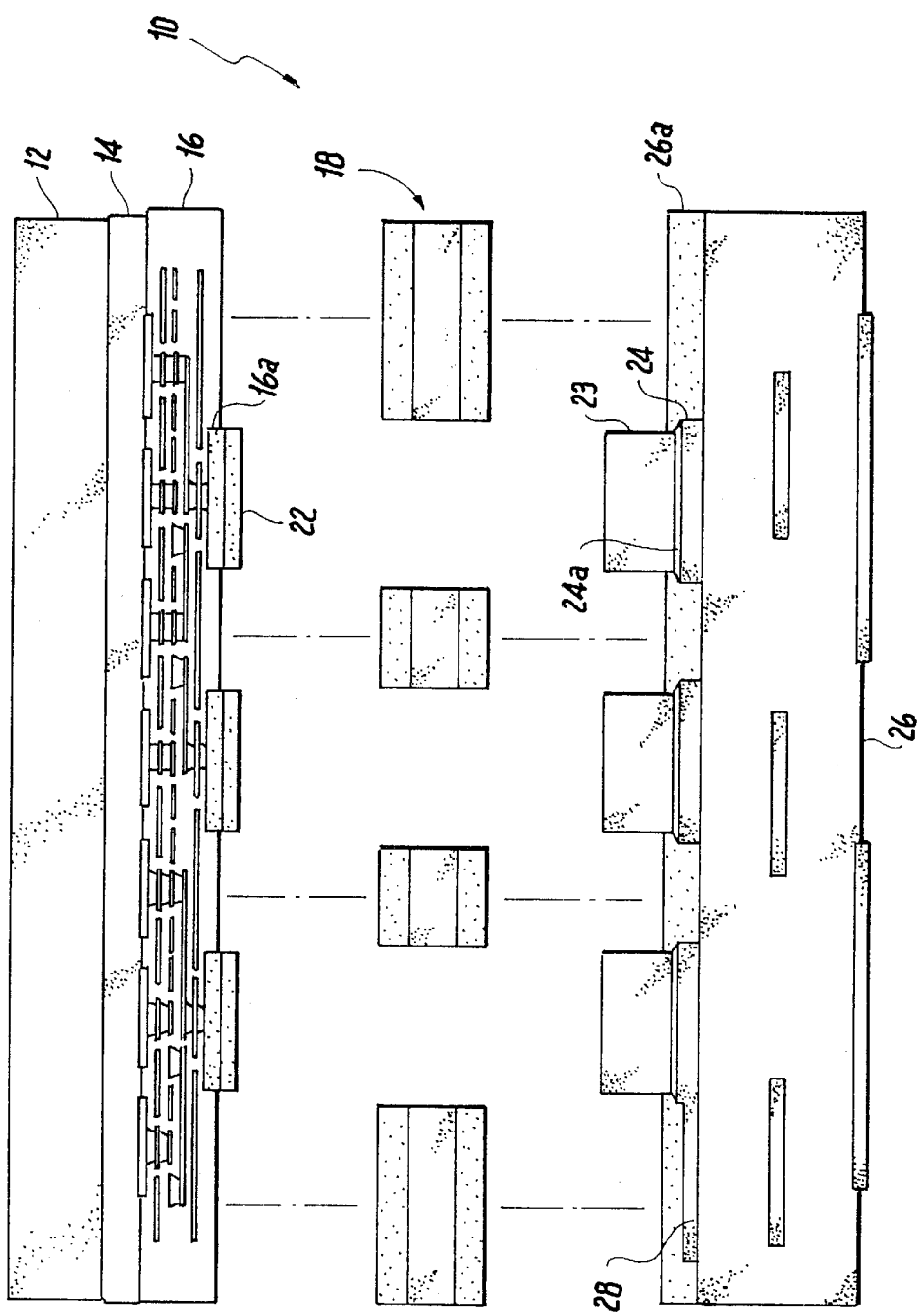
FIG. 1a illustrates, diagrammatically by, an exploded view of a first step in forming a first embodiment relating to an organic laminate substrate analog to a known ceramic substrate wherein a thin film is attached to a substrate, wherein the substrate is shown as an organic laminate with eutectic solder.
Figure 1B:
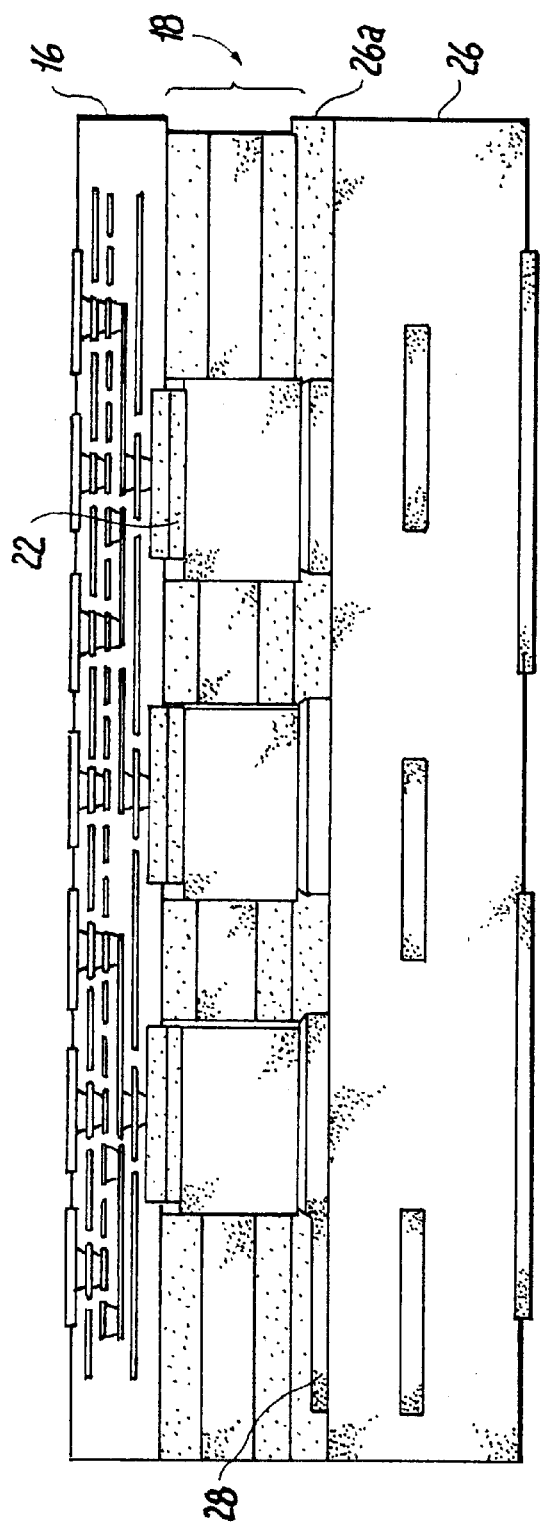
FIG 1b illustrates the embodiment of FIG. 1a, in which the thin film is joined to the laminate.
Figure 1C:
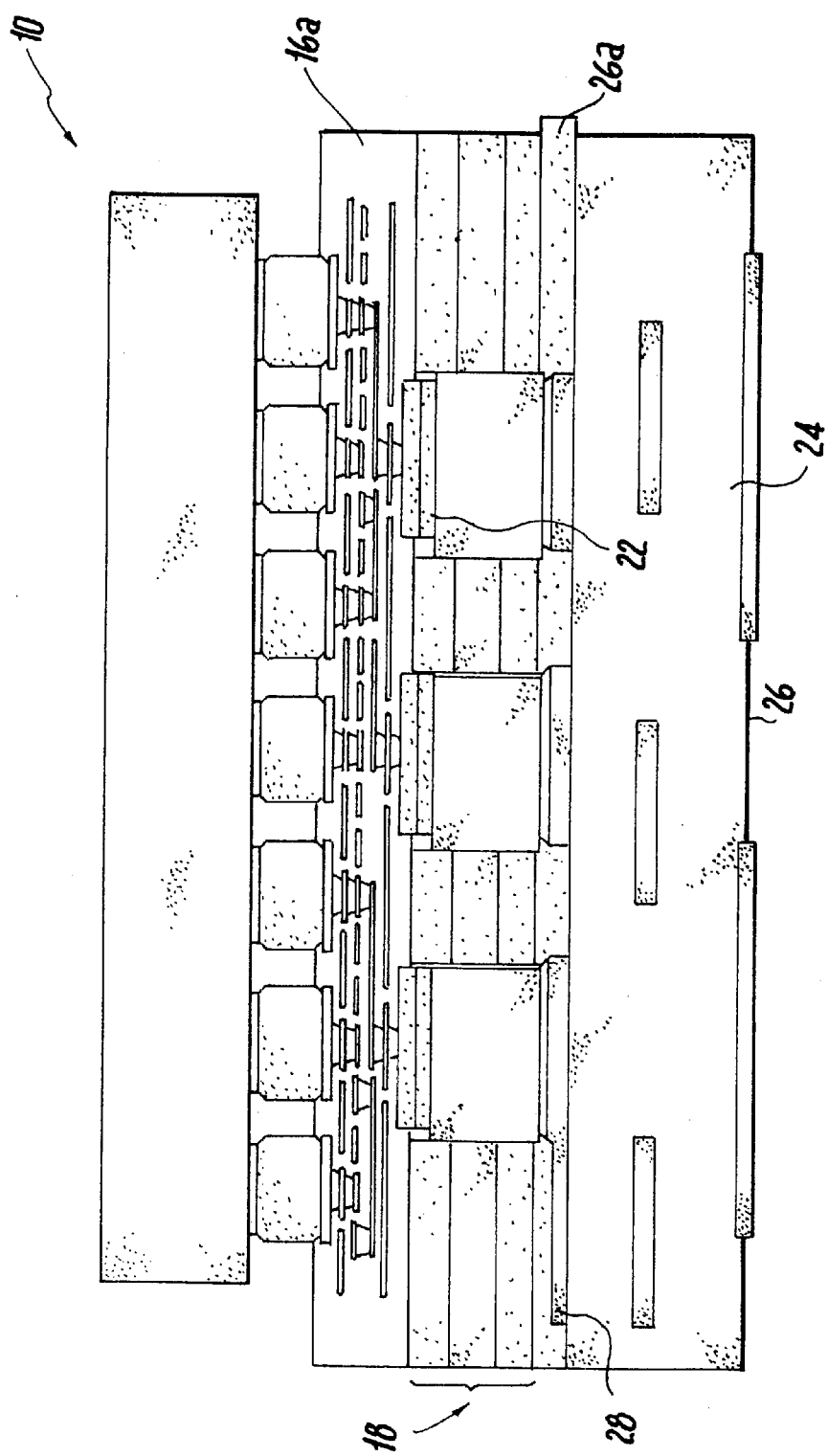
FIG. 1c illustrates the embodiment as shown in FIGS. 1a and 1b, with a semiconductor chip being joined to the thin film.

Referring more specifically to the drawings, FIGS. 1a to 1c illustrate processing steps of a ceramic joining analog scenario 10 utilizing an optional carrier plate 12 superimposed on a flip-flop adhesive 14. A thin film 16 with joining metallurgy patterns 16a is plated with a nickel material 22.

Referring to FIG. 1a, there is shown a eutectic solder 23 on an array pad 24 and on an organic wiring board laminate 26 having a copper layer 28 thereon. This arrangement requires a spacer and adhesive 18 for alignment and may be able to handle a rougher topography with the possibility of lower temperature joining. The use of eutectic solder as an interconnection means for attaching the thin film to the printed wiring board is essentially effected, by way of example, as follows:

After standard printed wiring board laminate 26 fabrication, an adhesion promoter of a solution containing benzotriazole (such as Entek) is used on the copper pads 24. Other plating steps can also be performed, such as gold plating (optional) shown at 24a.

APSR 4000 BN (sold by Taiyo Co.) solder mask 26a (optional) was screened, exposed and developed leaving 10 mil diameter openings around 6 mil Cu pads 24 for joining. The solder mask 26a thickness was 1.0–1.3 mil over laminate and 0.3–0.5 mil over Cu lines 28. The solder mask was thermally cured followed by Entek. Eutectic solder paste was then screened onto the Cu pads.

Pyralux LF 1-1-1 (sold by Dupont Corp) (3 mil thick) was mechanically drilled with 10 mil openings for joining as adhesive layer 18. The thin film 16 was prepared on a 2 mil polyimide dielectric with 6 mil diameter, 1.5 mil thick Cu pads 16a and then overplated with 2.5. micron Ni (nickel) electroplate and 0.25 micron soft Au (gold) electroplate to form pad 22 for subsequent joining to the laminate. The top side of the polyimide did not use the optional temporary carrier 12, but had a Cu stitch pattern for electrical testing after joining (not shown).

Joining was performed at 300 psi at 195 C. for 90 minutes at temperature. The resulting structure is shown in FIG. 1b, after attaching a surface mount component is shown in FIG. 1c. Test results (electrical and mechanical cross section) showed excellent alignment and electrical performance. Continuity was established from pads 22 on the thin film pad 24 to the laminate.

Figure 2:
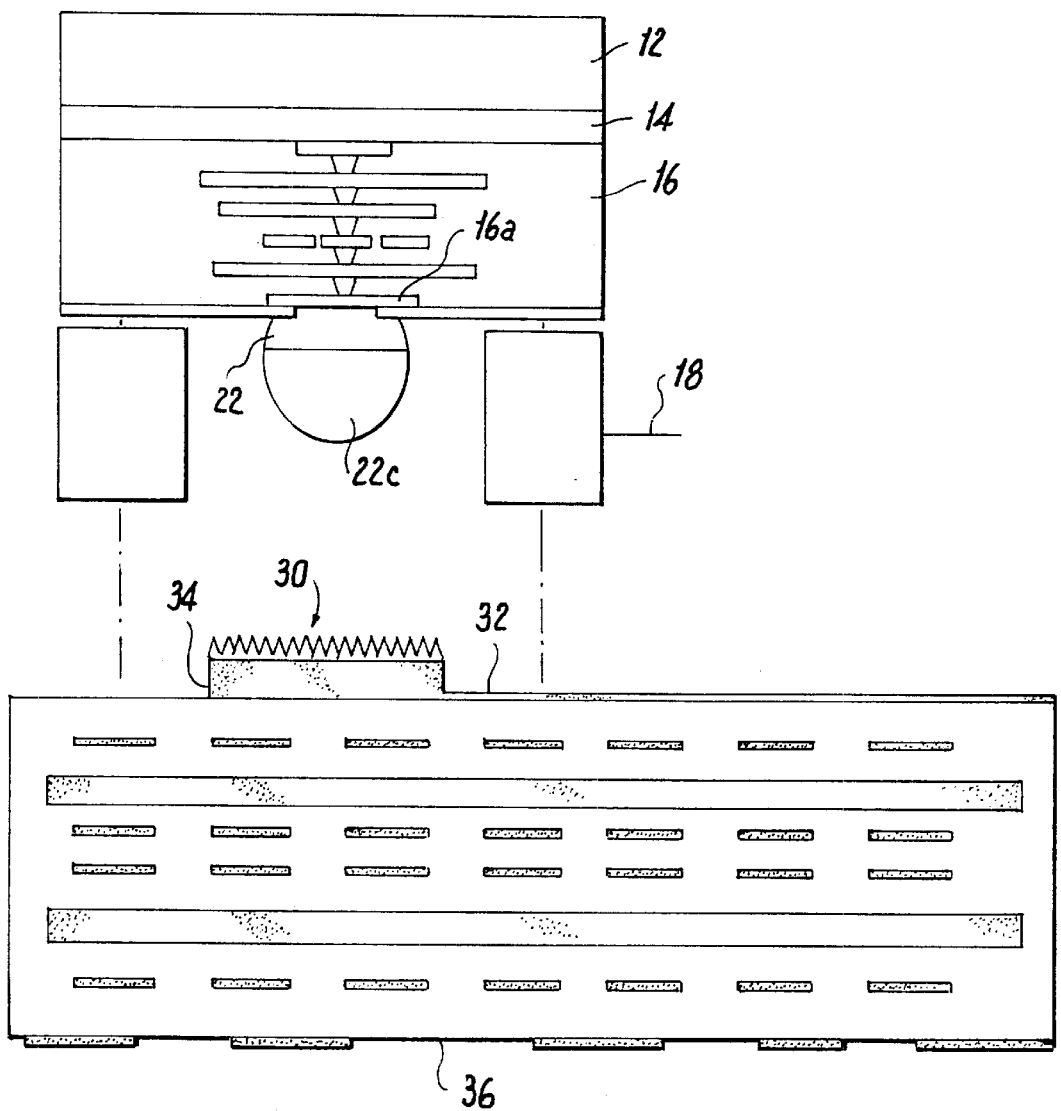
FIG. 2 illustrates, diagrammatically, thin film joining to a printed circuit board substrate utilizing dendrites.

As shown in FIG. 2 of the drawings, pursuant to a modified option, there is employed a dendritic interconnection using dendrites, wherein palladium (Pd) dendrites 30 on copper 32 in the form of a layer, are employed on a pad 34 above an organic laminate printed wiring board 36. Suitable joining may be implemented by pressure, and if necessary with the use of heat as an optional feature. Alternatives may be the use of a spacer, or of an underfill, or without the need for any spacer.

This embodiment provides an alternate means for achieving an electrical connection. In this case a solder ball 22c is formed on the film pad 22 using known processes such as vapor deposition, or screening for example. The solder ball 22c could be of a variety of tin lead alloys, or of alternate composition. On the surface of the printed wiring board pad 34 are palladium dendrites which are formed using known plating processes, such as in Bindra et al U.S. Pat. No. 5,185,073 entitled "Method of Fabricating Dendritic Materials", the disclosure of which is incorporated herein by reference.

FIG. 2 shows the thin film 16 temporarily supported on carrier 12 with a removable bonding adhesive 14. Film pad 22 connects to internal wiring 16a.

The thin film, the spacer material and the printed wiring board are placed in alignment, and upon the application of heat and pressure, the solder ball 22c will form an electrical interconnection with the Pd dendrites 30 by means of the dendrites penetrating the softer solder ball 22c. Simultaneously, mechanical adhesion of the film to the printed wiring board is achieved by the mechanical bonding of the adhesive layer 18.

Figure 3:
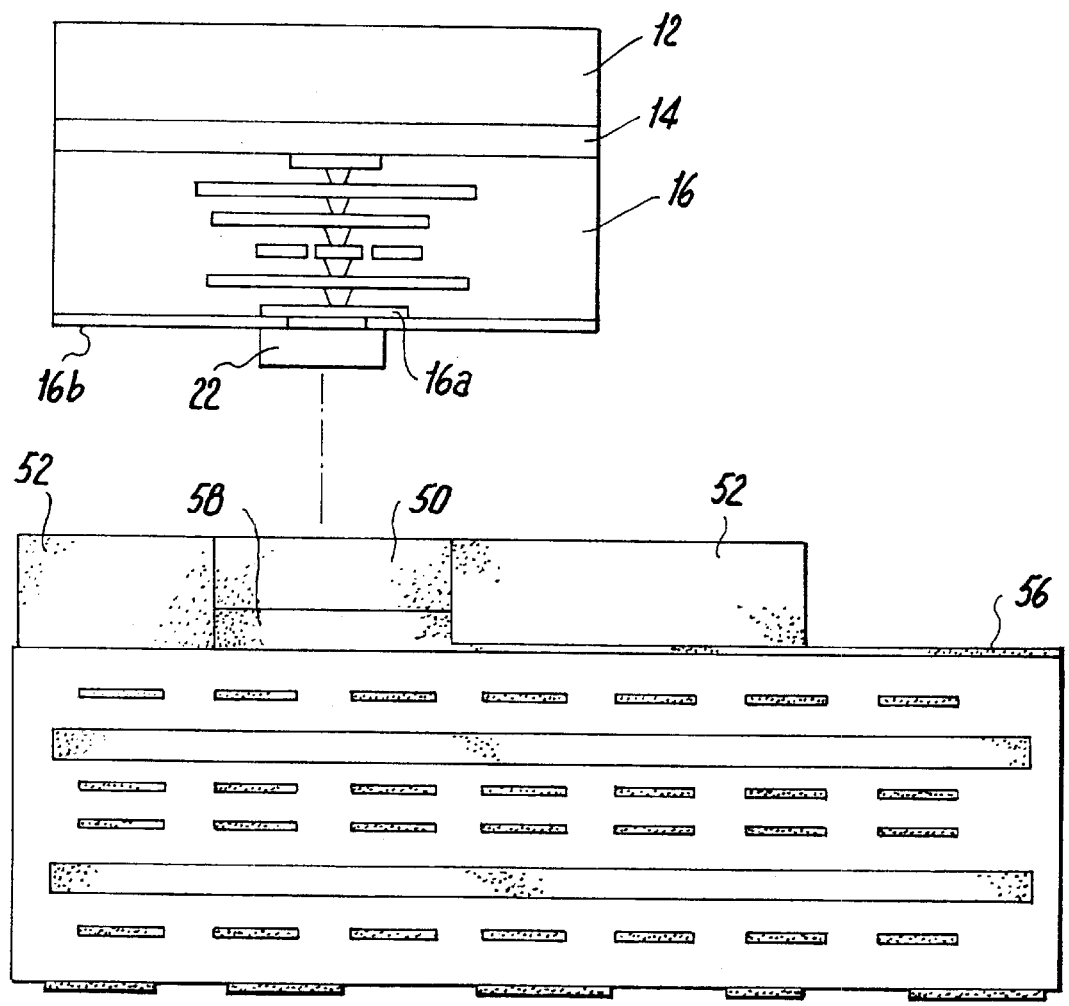
FIG. 3 illustrates the joining of the thin film and a laminate substrate with conductive adhesives.

Finally, as illustrated in FIG. 3, there is employed a conductive adhesive 50 for the laminate wherein an interposed spacer adhesive 52 (Dyna Via 2000 by Shipley Ronal) is utilized above the copper line 56 and the substrate pad 58 is covered with the conductive adhesive 50 with adjoining spacer adhesive. The isotropically conductive adhesives for the laminate enable joining below 200° C., yet no melting is encountered when effecting ball grid array (BGA) soldering (215° C.) since the adhesive is cured.

Employed may be a Bi/Sn copper powder filler, or a commercially available Ablestick 8175, (silver filled epoxy thermoset) in a thermoset polymer as the conductive adhesive, so as to forms a metallurgical bond between conductors. It is also possible to employ anisotropic conductive adhesive pastes.

This embodiment can be practiced in the following manner:

The photosensitive material 52 is applied before the adhesive and openings are formed using known processes such as vacuum lamination and photolithography. It is desirable to not completely cure or cross-link the material 52 at this state. Subsequently, the conductive adhesive can be selectively deposited atop the pads 58 by any of several known ways such as screening or stenciling. The pre-existing openings in the photosensitive material 52 aid in controlling the position and volume of adhesive that is deposited. The conductive adhesives could be a thermoset or thermoplastic resin, filled with conducting particles. Such materials are commercially available, and example of which is Ablestick 8175, which is a thermosetting epoxy resin with silver particles.

After depositing the conductive adhesive, it could be partially cured, if required. In the assembly step, of the thin film, with protruding pads 22, is aligned and placed with reference to the printed wiring board and pads 58. Upon an application of heat and pressure, the, pads 22 will bond to the conductive adhesive 50 to form an electrical connection. Material 52 will bond to surface 16b on the thin film to provide mechanical reinforcement.

The foregoing enables forming connections wherein low temperatures and pressures may be employed the manufacture thereof, and wherein the adhesives may be a silver-filled epoxy thermoset of a conductive paste containing Bi/Sn copper powder filler, produces a superior metallurgical bond between conductors, thereby utilizing a lower resistance connection.

It is possible to use an anisotropic conductive adhesive paste, wherein the screened adhesive may be a film, which may be partially cured to reduce bleeding of its components through joining.

The laminated surface is assembled by a lamination joining step at or below 200° C., and wherein the electrical connection is made through the conductive adhesive. Apertures in the spacer 52 are an aid in effecting registration of the components wherein the strength of the joint between the thin film and the laminate is maintained by a good bond of the spacer.

The present invention may utilize a photoimaged interposer which does not require any mechanical alignment of a punched thin film and the photodeveloped vias in the interposer to hold a conductive adhesive preventing migration of conductors. Wells may be formed and also assist in the alignment of the laminate substrate relative to the thin film.

Utilizing the eutectic solder connections also results in a connection, which enables the use of dendrites which prevent slippage of the thin film during the lamination. This facilitates the connection to be made with pressure by itself without the application of heat and whereby the optional thin film carrier glass can be removed prior to fully heating and curing the material. This avoids the problem of encountering any large CTE mismatch between the carrier and the laminate, and also the further advantage that the joints can be tested prior to permanently forming the lamination.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

What is claimed is:

1. An electronic interconnection assembly for joining a thin film to a substrate comprising an organic laminate in the forming of a wiring package for an electronic device, comprising:

a multilayer thin film having a top surface and a bottom surface with at least one connection electrode; and said organic laminate substrate including a first surface having at least one substrate connection electrode, said substrate having a joining electrically conductive material deposited thereon; said joining material forming a bond between said thin film and substrate at a low pressure condition and selectively at low temperature processing conditions.

2. An assembly as claimed in claim 1, wherein said top surface of said thin film is coated with an adhesive fixed to a carrier plate.

3. An assembly as claimed in claim 1, wherein said substrate connection electrode is surrounded by a solder mask.

4. An assembly as claimed in claim 1, wherein said electrically conductive material consists of an adhesive.

5. An assembly as claimed in claim 4, wherein said adhesive comprises a photolithographed adhesive material.

6. An assembly as claimed in claim 1, wherein said joining material further includes a dielectric spacer material.

7. An assembly as claimed in claim 6, wherein said spacer material is photoimagable.

8. An assembly as claimed in claim 1, wherein said thin film has solder balls provided at wiring connections thereof, said substrate having conductive pads each comprising a dendrite-plated copper pad matching said solder balls, and palladium dendrites being plated on said conductive pads.

9. An assembly as claimed in claim 8, wherein said joining material further comprises a spacer material, said thin film being connected to said substrate through the selective application of heat and pressure so as to force said dendrite plated copper pad to penetrate the therewith mated solder material to both said substrate and thin film.

10. An assembly as claimed in claim 6, wherein said spacer material comprises a predrilled apertured spacer material forming said further joining material.

11. An assembly as claimed in claim 1, wherein said thin film comprises a polyimide film.

12. An assembly as claimed in claim 2, wherein said carrier plate comprises a glass ceramic material.

13. An assembly as claimed in claim 4, wherein said adhesive is an isotropic conductive adhesive.

14. An assembly as claimed in claim 4, wherein said adhesive is an anisotropic conductive adhesive.

15. An assembly as claimed in claim 1, wherein said thin film is bonded to said substrate through the interposition of a dendritic interconnection.

16. An assembly as claimed in claim 1, wherein said joining material comprises a silver-filled epoxy thermoset of a conductive paste.

17. An assembly as claimed in claim 16, wherein said silver-filled epoxy thermoset comprises Abelstick 8175.

18. An assembly as claimed in claim 16, wherein said conductive paste contains a Bi/Sn copper filler.

19. An assembly as claimed in claim 1, wherein said joining material comprises a patterned interposed spacer material positioned between said thin film and said substrate.

* * * * *